(12) United States Patent
Sung

(10) Patent No.: US 10,707,375 B2
(45) Date of Patent: Jul. 7, 2020

(54) LIGHT EMITTING DEVICE

(71) Applicant: LG INNOTEK CO., LTD., Seoul (KR)

(72) Inventor: Youn Joon Sung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/736,263

(22) PCT Filed: Jul. 4, 2016

(86) PCT No.: PCT/KR2016/007174
§ 371 (c)(1),
(2) Date: Dec. 13, 2017

(87) PCT Pub. No.: WO2017/010715
PCT Pub. Date: Jan. 19, 2017

(65) Prior Publication Data
US 2018/0182920 A1 Jun. 28, 2018

(30) Foreign Application Priority Data
Jul. 16, 2015 (KR) .......................... 10-2015-0100861

(51) Int. Cl.
*H01L 33/00* (2010.01)
*H01L 33/24* (2010.01)
(Continued)

(52) U.S. Cl.
CPC ............ *H01L 33/24* (2013.01); *H01L 33/007* (2013.01); *H01L 33/38* (2013.01); *H01L 33/44* (2013.01);
(Continued)

(58) Field of Classification Search
CPC ........ H01L 33/24; H01L 33/007; H01L 33/38
See application file for complete search history.

(56) References Cited

U.S. PATENT DOCUMENTS

| 6,911,351 B2 * | 6/2005 | Kidoguchi .......... H01L 21/0237 257/103 |
| 7,682,944 B2 | 3/2010 | Brandes et al. |
| 2008/0251803 A1 * | 10/2008 | Cho .................... H01L 33/10 257/94 |

FOREIGN PATENT DOCUMENTS

| JP | 2004-055799 | 2/2004 |
| JP | 3911699 | 5/2007 |

(Continued)

OTHER PUBLICATIONS

International Search Report (with English Translation) and Written Opinion dated Oct. 12, 2016 issued in Application No. PCT/KR2016/007174.

*Primary Examiner* — Kimberly N Rizkallah
*Assistant Examiner* — Alexander Belousov
(74) *Attorney, Agent, or Firm* — Ked & Associates, LLP

(57) ABSTRACT

An embodiment provides a light emitting element comprising: a first conductive semiconductor layer including a first layer and a second layer; an active layer on the first conductive semiconductor layer; a second conductive semiconductor layer on the active layer; and a first electrode and a second electrode arranged on the first conductive semiconductor layer and the second conductive semiconductor layer, respectively, wherein the first layer includes a plurality of first grooves, and a growth prevention layer is arranged on the bottom surface and side surfaces of each of the first grooves.

19 Claims, 8 Drawing Sheets

(51) Int. Cl.
  *H01L 33/38* (2010.01)
  *H01L 33/44* (2010.01)
  *H01L 33/20* (2010.01)
  *H01L 33/12* (2010.01)
  *H01L 33/32* (2010.01)
  *H01L 33/50* (2010.01)
  *H01L 33/54* (2010.01)
  *H01L 33/62* (2010.01)

(52) U.S. Cl.
  CPC .............. *H01L 33/12* (2013.01); *H01L 33/20* (2013.01); *H01L 33/32* (2013.01); *H01L 33/507* (2013.01); *H01L 33/54* (2013.01); *H01L 33/62* (2013.01); *H01L 2933/0025* (2013.01)

(56) References Cited

FOREIGN PATENT DOCUMENTS

| | | |
|---|---|---|
| KR | 10-0775137 | 11/2007 |
| KR | 10-2012-0095080 | 8/2012 |
| KR | 10-2012-0116670 | 10/2012 |
| KR | 10-2014-0089707 | 7/2014 |
| KR | 10-2014-0131891 | 11/2014 |

\* cited by examiner

LIGHT EMITTING DEVICE

CROSS-REFERENCE TO RELATED PATENT APPLICATIONS

This application is a U.S. National Stage Application under 35 U.S.C. § 371 of PCT Application No. PCT/KR2016/007174, filed Jul. 4, 2016, which claims priority to Korean Patent Application No. 10-2015-0100861, filed Jul. 16, 2015, whose entire disclosures are hereby incorporated by reference.

TECHNICAL FIELD

Embodiments relate to a light emitting device, more particularly, to a light emitting device having a nitride-based light emitting structure with improved quality.

BACKGROUND ART

Semiconductors based on Group III-V compounds such as GaN and AlGaN are widely used for optoelectronics, electronic devices and the like owing to many benefits of having a wide and easily controllable bandgap energy.

Light emitting devices such as light emitting diodes or laser diodes using Group III-V or II-IV compound semiconductor materials can render a variety of colors such as red, green, blue and UV light through development of thin film growth techniques and device materials, realize white light with superior efficiency by using a fluorescent material or combining colors and have advantages such as low power consumption, semi-permanent lifespan, rapid response rate, safety and environmental friendliness, as compared to conventional light sources such as fluorescent lamps and incandescent lamps.

Accordingly, these light emitting devices are increasingly applied to transmission modules of optical communication units, light emitting diode backlights as a replacement for cold cathode fluorescent lamps (CCFLs) constituting backlights of liquid crystal display (LCD) devices, and lighting apparatuses using white light emitting diodes as a replacement for fluorescent lamps or incandescent lamps, headlights for vehicles and traffic lights.

A light emitting device may use GaN as a nitride-based semiconductor for a light emitting structure and the light emitting structure may include a first conductivity-type semiconductor layer, an active layer and a second conductivity-type semiconductor layer.

The nitride-based semiconductor layer grown on a sapphire substrate, which is an insulating substrate, may have defects deteriorating crystallinity such as dislocation, meltback, cracks, pits and surface morphology since the substrate and the light emitting structure include different materials and there are thus lattice mismatch and great differences in thermal expansion coefficients therebetween.

In order to prevent dislocation among these problems, epitaxial lateral over-growth (ELOG) or Pendeo growth methods have been suggested.

FIGS. 1 and 2 show growth of a conventional nitride-based semiconductor.

FIG. 1 shows an ELOG growth method. Masks are formed with silicon oxide ($SiO_2$) in the center of a nitride-based semiconductor (GaN) grown on a substrate, and the nitride-based semiconductor grown in a region between masks is grown vertically as well as horizontally above the masks, thereby removing defects in the region on the mask.

FIG. 2 shows a Pendeo growth method. A substrate is etched to form grooves and a nitride-based semiconductor layer is grown on the substrate in regions where the grooves are not formed. In this case, the nitride-based semiconductor grown in a part of the substrate is grown vertically and horizontally, so that the nitride-based semiconductor layer can be formed over the entire top surface of the substrate.

However, conventional nitride-based semiconductor growth methods have the following problems.

The ELOG method may lead to tilt resulting from friction between silicon oxide used as a mask and GaN, thus causing dislocation. In addition, it takes a prolonged time for the nitride-based semiconductor to horizontally grow on the mask as well as over the entire region above the mask.

The Pendeo method requires etching to the sapphire substrate. In this regard, process time is lengthened and it is difficult to etch an accurate pattern on the sapphire substrate.

DISCLOSURE

Technical Problem

An object of the present invention devised to solve the problem lies in a light emitting device that has excellent quality by reducing crystal defects such as dislocation during growth of a light emitting structure.

Technical Solution

The object of the present invention can be achieved by providing a light emitting device including a first conductivity-type semiconductor layer including a first layer and a second layer, an active layer disposed on the first conductivity-type semiconductor layer, a second conductivity-type semiconductor layer disposed on the active layer, and a first electrode and a second electrode disposed on the first conductivity-type semiconductor layer and the second conductivity-type semiconductor layer, respectively, wherein the first layer comprises a plurality of first grooves and a growth prevention layer is disposed on a bottom surface and a side surface of the first groove.

The growth prevention layer may include a material selected from the group consisting of $SiO_2$, $Si_3N_4$, SiC, $Al_2O_3$, AlN, $HfO_2$, $TiO_2$, $ZrO_2$, $Ta_2O_3$, Cr, Ta, Mo and W.

A portion of the second layer may be inserted into an upper part of the first groove.

A void may be formed in a part of the first groove.

A thickness of the growth prevention layer on the side surface of the first groove may be 30 nanometers or more.

A thickness of the growth prevention layer in an upper part of the first groove may be smaller than a thickness of the growth prevention layer in a lower part of the first groove.

The growth prevention layer may have an inclination on the side surface of the first groove.

A height of the growth prevention layer in a region where the growth prevention layer contacts the side surface of the first groove may be greater than a height of the growth prevention layer in a region where the growth prevention layer contacts an inner part of the first groove.

A height from a bottom surface of the growth prevention layer to a top surface of the growth prevention layer may be 200 nanometers to 2000 nanometers.

A boundary of the growth prevention layer in a region where the growth prevention layer contacts the side surface of the first groove may form an angle of 70 degrees or less with a boundary of the growth prevention layer in a region where the growth prevention layer contacts an inner part of the first groove.

The growth prevention layer may have an inclination on the side surface of the first groove, a portion of the second layer may be inserted into an upper part of the first groove, and an end of the second layer may be disposed on the side surface of the growth prevention layer.

In another aspect of the present invention, provided herein is a light emitting device including a first conductivity-type semiconductor layer including a first layer and a second layer, an active layer disposed on the first conductivity-type semiconductor layer, a second conductivity-type semiconductor layer disposed on the active layer, and a first electrode and a second electrode disposed on the first conductivity-type semiconductor layer and the second conductivity-type semiconductor layer, respectively, wherein the first layer includes a plurality of first grooves, a first growth prevention layer and a second growth prevention layer are sequentially disposed on a bottom surface and a side surface of the first groove, and a height of a top of the first growth prevention layer contacting the first layer is greater than a height of a top of the second growth prevention layer.

A difference in height between the top of the first growth prevention layer and the top of the second growth prevention layer may be 200 nanometers to 2000 manometers.

A portion of the second layer may be inserted into an upper part of the first groove and may contact the first growth prevention layer.

The second layer may be spaced from the second growth prevention layer.

A total of a thickness of the first growth prevention layer and a thickness of the second growth prevention layer may be 30 nanometers or more.

An insulating substrate may be disposed under a first conductivity-type semiconductor layer.

Advantageous Effects

With regard to the light emitting device according to the embodiment, a growth prevention layer is disposed in a first groove in a first layer, a second layer grows in a horizontal direction and is formed in a region corresponding to the first groove, and dislocation is prevented in the second layer, thereby improving quality of the nitride-based semiconductor.

In addition, since a nitride-based semiconductor is not grown on the growth prevention layer, a void is formed in the first groove, which scatters light emitted from the active layer and travelling downward, thereby improving light extraction efficiency of the light emitting device.

BEST MODE

Reference will now be made in detail to the preferred embodiments of the present invention, examples of which are illustrated in the accompanying drawings.

In the description of embodiments, it will be understood that, when one element is referred to as being "on(above)" or "under(below)" another element, one element may directly contact the other element, or one or more intervening elements may also be present between the two elements. In addition, "on(above)" or "under(below)" may include upward and downward directions, based on any element.

In addition, relative terms such as "first" and "second", "on/over/above" and "under/below/beneath" neither require nor encompass any physical or logical relationships between such entities or elements, and are only provided to distinguish one entity or element from another entity or element.

Figure 1:
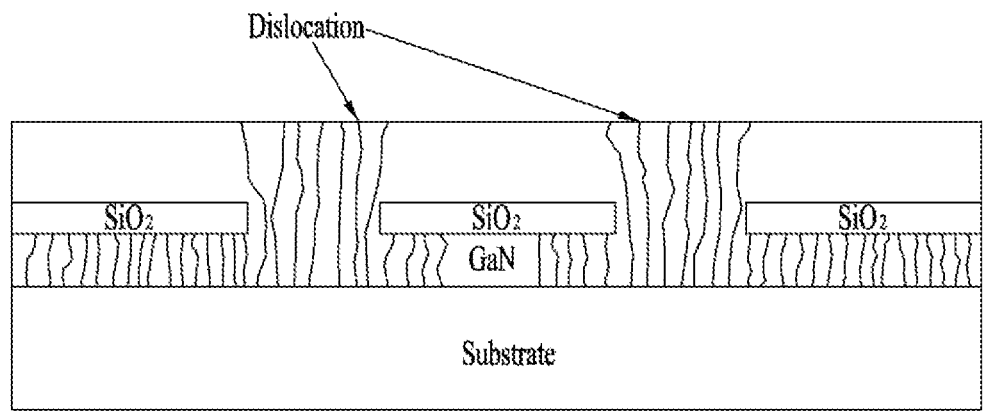
FIGS. 1 and 2 show growth of a conventional nitride-based semiconductor.
Figure 2:
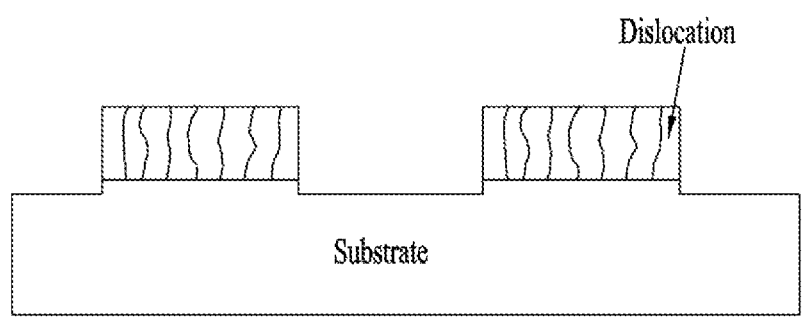
Figure 2:
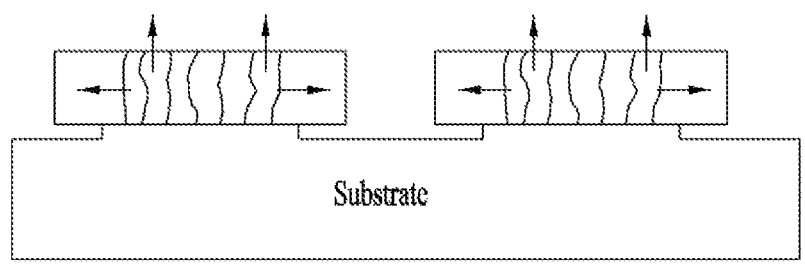
Figure 2:
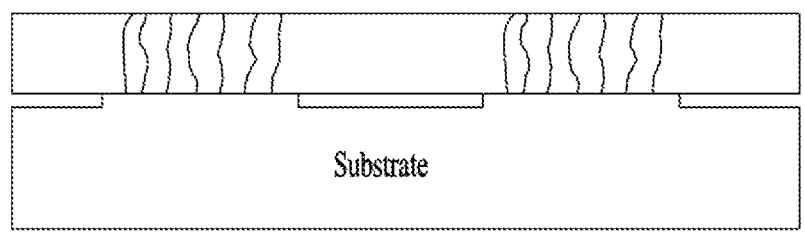
Figure 3A:
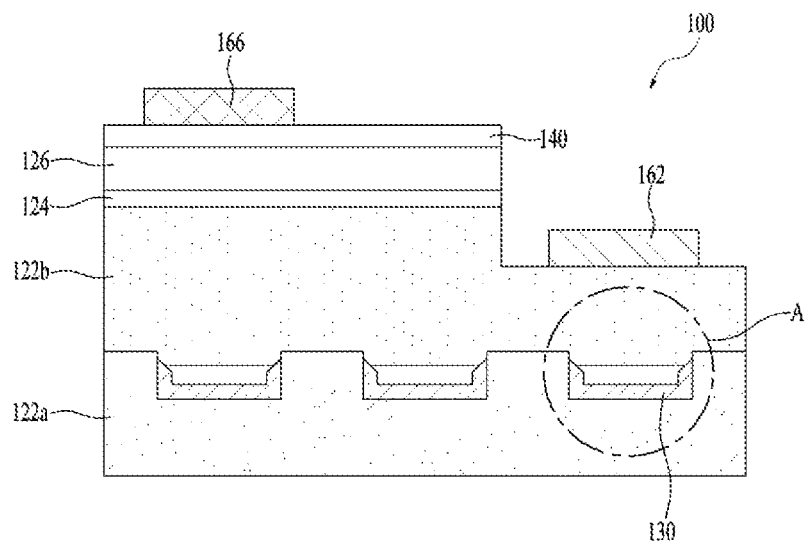
FIG. 3A is a sectional view illustrating a first embodiment of a light emitting device.
Figure 3B:
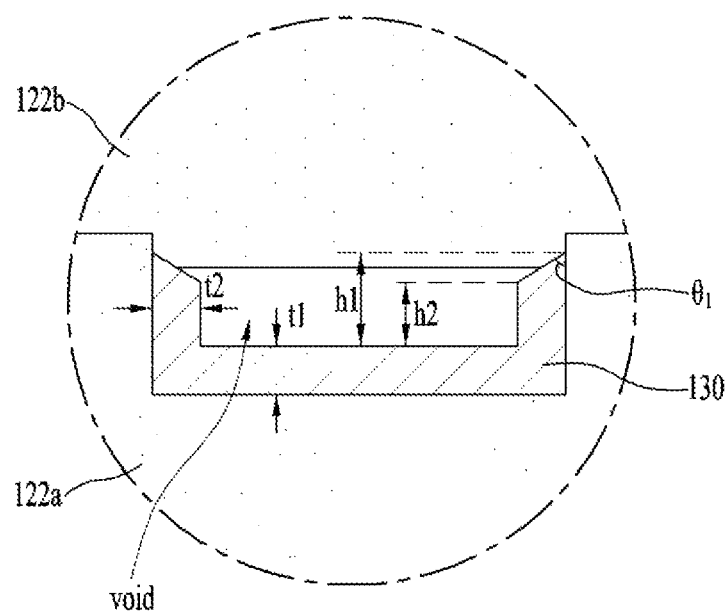
FIG. 3B is an enlarged view showing "A" of FIG. 3A.

FIG. 3A is a sectional view illustrating a first embodiment of a light emitting device and FIG. 3B is an enlarged view showing "A" of FIG. 3A.

The light emitting device 100 according to the embodiment includes a first conductivity-type semiconductor layer including a first layer 122a and a second layer 122b, an active layer 124, a second conductivity-type semiconductor layer 126, a light-transmitting conductive layer 140, a first electrode 162 and a second electrode 166.

The light emitting structure includes the first conductivity-type semiconductor layer, the active layer 124 and the second conductivity-type semiconductor layer 126. In this regard, without a different substrate, the first layer 122a, which is the first conductivity-type semiconductor layer, can be used as the substrate.

The first conductivity-type semiconductor layer may be implemented as a semiconductor based on a Group V or VI compound and may be doped with a first conductivity-type dopant. The first conductivity-type semiconductor layer may be formed using a semiconductor material having a structure of $Al_xIn_yG_{a(1-x-y)}N$ ($0 \le x \le 1$, $0 \le y \le 1$, $0 \le x+y \le 1$), for example, one or more of AlGaN, GaN, InAlGaN, AlGaAs, GaP, GaAs, GaAsP, or AlGaInP.

When the first conductivity-type semiconductor layer is an n-type semiconductor layer, the first conductivity-type dopant may include an n-type dopant such as Si, Ge, Sn, Se, or Te.

The first layer 122a includes a plurality of first grooves in an upper part thereof, and the shape and size of the respective first grooves may not be identical.

A growth prevention layer 130 may be disposed on the bottom and side surfaces of the first groove. The growth prevention layer 130 may include a material selected from the group consisting of $SiO_2$, $Si_3N_4$, SiC, $Al_2O_3$, AlN, $HfO_2$, $TiO_2$, $ZrO_2$, $Ta_2O_3$, Cr, Ta, Mo and W.

The growth prevention layer 130 may contact the first layer 122a on the bottom surface and the side surface of the groove, a second groove may be referred to as a region which is defined by the bottom surface and the side surface of the growth prevention layer 130, and the width and height of the second groove may be smaller than those of the first groove.

The second layer 122b may be grown after growth of the first layer 122a, formation of the first groove and disposition of the growth prevention layer 130, and a portion of a lower region of the second layer 122b may be inserted into an upper part of the first groove.

In this case, the second layer 122b may not fill the entire region of the first groove and the second groove and a void may be formed in the first groove and the second groove. The void may be filled with air.

The growth prevention layer 130 may be disposed so as to cover the entire bottom surface of the first groove and the growth prevention layer 130 may be not disposed in a part of an upper region of the side surface of the first groove.

The growth prevention layer 130 functions to inhibit or prevent growth of a nitride-based semiconductor and the thickness t2 of the side surface of the growth prevention layer 130 may be smaller than the thickness t1 of the bottom surface of the growth prevention layer 130.

The thickness t2 of the side surface of the growth prevention layer 130 may be, for example, 30 nanometers or more.

In addition, the thickness t2 of the side surface of the growth prevention layer 130 may be smaller in an upper part of the first groove than a lower part of the first groove. That is, as shown in FIG. 3B, the growth prevention layer 130 may be disposed to be inclined on the side surface of the first groove and a height of the growth prevention layer 130 contacting the side surface of the first groove may be greater than a height of a region where the growth prevention layer 130 contacts the inner part of the groove.

In this case, the boundary of the growth prevention layer 130 in a region where the growth prevention layer 130 contacts the side surface of the first groove may form an angle (θ1) of 70 degrees or less with the boundary of the growth prevention layer 130 in a region where the growth prevention layer 130 contacts the inner part of the first groove.

Figure 3C:
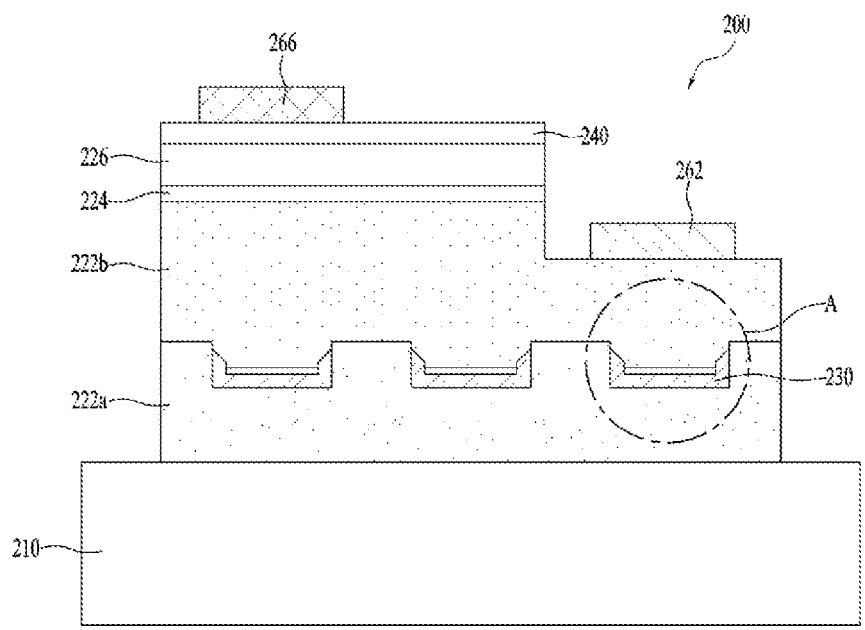
FIG. 3C is a sectional view illustrating a second embodiment of a light emitting device.

In addition, the second layer 122b may be disposed such that a part of the second layer 122b contacts an inclined region of an end of the growth prevention layer 130. A bottom surface of the second layer 122b, which is inserted into the first groove, may be disposed in the inclined region of the end of the growth prevention layer 130, but, as shown in FIG. 3C, the bottom surface of the second layer 122b inserted into the first groove may be disposed on the side surface of the growth prevention layer 130.

A height h1 from the bottom surface of the growth prevention layer 130 to the top surface of the growth prevention layer 130 may be 200 nanometers to 2000 nanometers.

In addition, a height h1 from the bottom surface of the growth prevention layer 130 to a region of the growth prevention layer 130 contacting the side surface of the first groove may be at least 100 nanometers greater than a height h2 from the bottom surface of the growth prevention layer 130 to a region of the growth prevention layer 130 contacting the inner region of the first groove.

The active layer 124 may be disposed between the second layer 122b and the second conductivity-type semiconductor layer 126 and include a double hetero structure, a multi-quantum well structure, a mono-quantum well structure, a multi-quantum well (MQW) structure, a quantum dot structure or a quantum wire structure.

The active layer 124 may be formed with a pair structure of well layer/barrier layer, for example, one or more of AlGaN/AlGaN, InGaN/GaN, InGaN/InGaN, AlGaN/GaN, InAlGaN/GaN, GaAs(InGaAs)/AlGaAs, GaP(InGaP)/Al-GaP, using compound semiconductor materials based on Group V elements, but the present invention is not limited thereto.

The well layer may be formed using a material having a smaller energy bandgap than that of the barrier layer.

The second conductivity-type semiconductor layer 126 may be formed using a semiconductor compound. The second conductivity-type semiconductor layer 126 may be implemented as a compound semiconductor based on a Group V or VI element or the like and may be doped with a second conductivity-type dopant. The second conductivity-type semiconductor layer 126 may, for example, include a semiconductor material having a structure of $In_xAl_yGa_{1-x-y}N$ ($0 \leq x \leq 1$, $0 \leq y \leq 1$, $0 \leq x+y \leq 1$), such as one or more of AlGaN, GaN AlInN, AlGaAs, GaP, GaAs, GaAsP, or AlGaInP. For example, the second conductivity-type semiconductor layer 326 may include $Al_xGa_{(1-x)}N$.

When the second conductivity-type semiconductor layer 126 is a p-type semiconductor layer, the second conductivity-type dopant may be a p-type dopant such as Mg, Zn, Ca, Sr or Ba. The second conductivity-type semiconductor layer 126 may be formed in the form of a monolayer or multilayer, but the present invention is not limited thereto.

Although not shown, an electron blocking layer may be disposed between the active layer 124 and the second conductivity-type semiconductor layer 126. The electron blocking layer may have a superlattice structure and the superlattice may be formed by disposing AlGaN doped with a second conductivity-type dopant, or alternately disposing a plurality of GaN layers with different aluminum composition ratios.

When the second conductivity-type semiconductor layer 126 is p-type GaN, injection of current from the second electrode 166 may be poor. Therefore, a light-transmitting conductive layer 140 may be disposed on the second conductivity-type semiconductor layer 126 and the light-transmitting conductive layer 140 may, for example, include indium tin oxide (ITO).

Mesa-etching may be conducted from the second conductivity-type semiconductor layer 126 to the active layer 124 and a part of the second layer 122b, the first electrode 162 may be disposed on the etched and exposed second layer 122b and the second electrode 166 may be disposed on the light-transmitting conductive layer 140.

The first electrode 162 and the second electrode 166 may be formed with a monolayer or multilayer structure including at least one of aluminum (Al), titanium (Ti), chromium (Cr), nickel (Ni), copper (Cu) or gold (Au).

Although not shown, a passivation layer is disposed on the side surface of the exposed light emitting structure to protect the light emitting structure from foreign matter and insulate the same.

FIG. 3C is a sectional view illustrating a second embodiment of a light emitting device.

The light emitting device 200 of the present embodiment may be the same as that of the first embodiment described above except that the first layer 222a is disposed on the substrate 210. The substrate 210 may be formed using a material suitable for growth of a semiconductor material or a carrier wafer, or a material with excellent thermal conductivity, and may include a conductive substrate or an insulating substrate. For example, the substrate 210 may include at least one of sapphire ($Al_2O_3$), $SiO_2$, SiC, Si, GaAs, GaN, ZnO, GaP, InP, Ge, or $Ga_2O_3$.

The light emitting device 100 according to the first embodiment utilizes GaN as a substrate for growth of a nitride-based semiconductor, while the light emitting device 200 according to the second embodiment utilizes an insulating substrate 210 for growth of the nitride-based semiconductor.

Figure 3D:
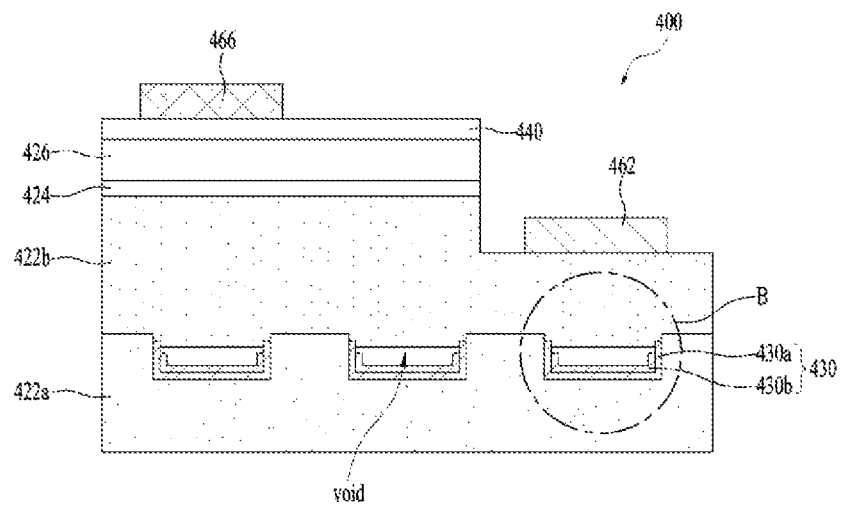
FIG. 3D is a sectional view illustrating a third embodiment of a light emitting device.
Figure 3E:
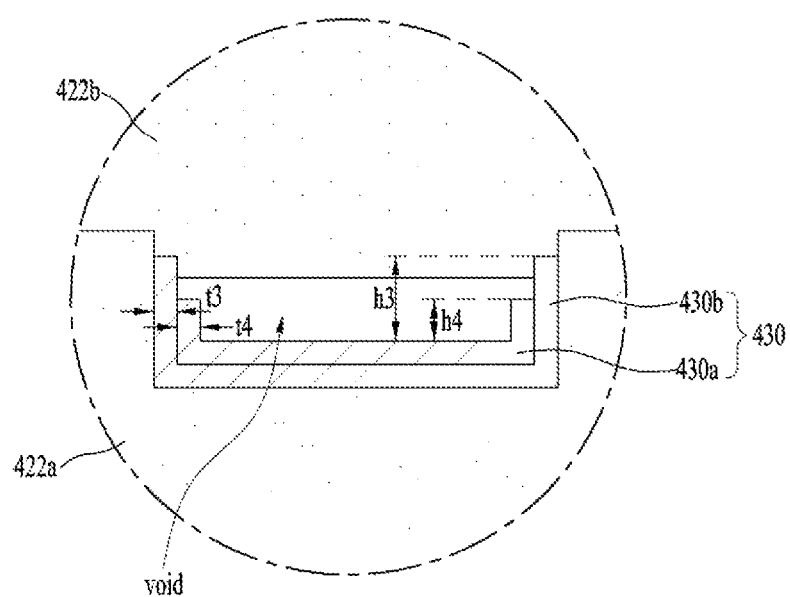
FIG. 3E is an enlarged view showing "B" of FIG. 3E.

FIG. 3D is an enlarged view illustrating a third embodiment of a light emitting device and FIG. 3E is an enlarged view showing "B" of FIG. 3D.

The light emitting device 400 according to the present embodiment is similar to the light emitting device 100 according to the first embodiment, but is different from the light emitting device 100 according to the first embodiment in that the growth prevention layer 430 includes a first growth prevention layer 430a and a second growth prevention layer 430b.

The first growth prevention layer 430a and the second growth prevention layer 430b may include the same material, for example, a material selected from the group consisting of $SiO_2$, $Si_3N_4$, SiC, $Al_2O_3$, AlN, $HfO_2$, $TiO_2$, $ZrO_2$, $Ta_2O_3$, Cr, Ta, Mo and W.

The first growth prevention layer 430a may be disposed on the bottom surface and the side surface of the first groove. The first growth prevention layer 430a may contact the first layer 422a on the bottom surface and the side surface of the groove. The second growth prevention layer 430b may be disposed on the bottom surface and the side surface of the first growth prevention layer 430a. In this regard, a second groove may be referred to as a region which is defined by the bottom surface and the side surface of the growth prevention layer 430, and the width and height of the second groove may be smaller than those of the first groove.

The second layer 422b may be grown after growth of the first layer 422a, formation of the first groove and disposition of the growth prevention layer 430, and a portion of a lower region of the second layer 422b may be inserted into an upper part of the first groove.

In this case, the second layer 422b may not fill the entire region of the first groove and the second groove, and a void may be formed in the first groove and the second groove. The void may be filled with air.

The first growth prevention layer 430 may be disposed so as to cover the entire bottom surface of the first groove and the growth prevention layer 430 may not be disposed in a part of an upper region of the side surface of the first groove.

The growth prevention layer 430 functions to inhibit or prevent growth of a nitride-based semiconductor and the thickness t3 of the growth prevention layer 430 may be equal to the thickness t4 of the growth prevention layer 430b. For example, a sum of the thicknesses (t3, t4) of the first growth prevention layer 430 and the second growth prevention layer 430b may be 30 nanometers or more and may be identical on the bottom surface and the side surface of the groove.

A height h3 from the bottom surface of the first growth prevention layer 430a to the top of the second growth prevention layer 430b may be 200 nanometers to 2000 nanometers. In addition, the first growth prevention layer 430a on the side surface of the first groove may be disposed to be higher than the second growth prevention layer 430b.

In addition, a height h3 from the bottom surface of the first growth prevention layer 430a to the top surface of the second growth prevention layer 430 may be at least 100 nanometers greater than a height h4 from the bottom surface of the second growth prevention layer 430b to the top surface of the second growth prevention layer 430b.

In addition, the end of the second layer 422b inserted into the first groove contacts the side surface of the first growth prevention layer 430a, but does not contact the second growth prevention layer 430b.

FIGS. 4A to 4F show an embodiment of a method for manufacturing a light emitting device according to a first embodiment.

Figure 4A:
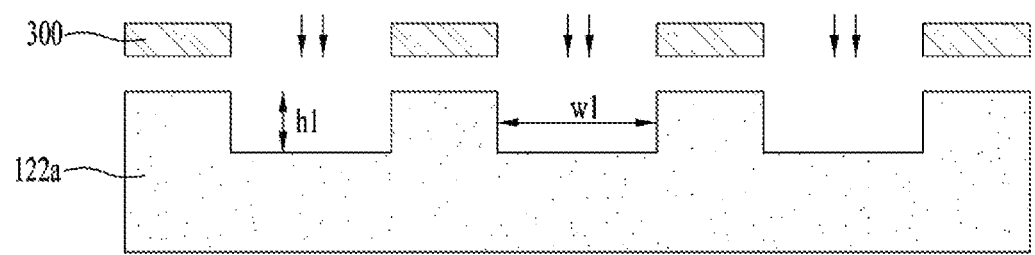
FIGS. 4A to 4F show an embodiment of a method for manufacturing a light emitting device according to a first embodiment.

As shown in FIG. 4A, a first layer 122a constituting a first conductivity-type semiconductor layer is grown and a first groove is formed using a mask 300. The width w1 and the height h1 of the first groove may be changed according to the size of the growth prevention layer 130 described below.

Figure 4B:
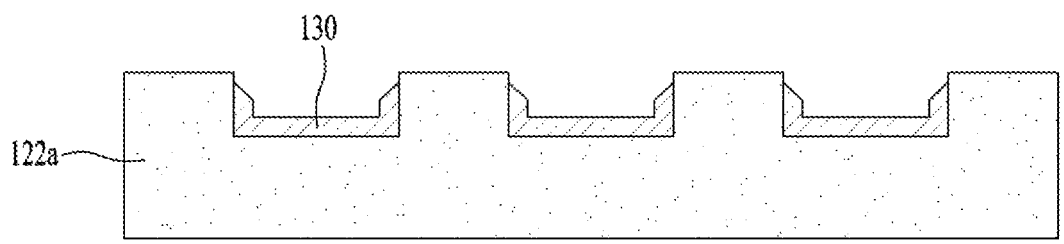

In addition, as shown in FIG. 4B, a growth prevention layer 130 is formed on a bottom surface and a side surface of the first groove. At this time, the growth prevention layer 130 may be disposed in the entire region of the bottom surface of the first groove and may be disposed in the entire region, excluding a part of an upper region of the side surface of the first groove, such that an end of the growth prevention layer 130 is inclined at the side surface of the first groove, as shown in FIG. 3A.

Figure 4C:
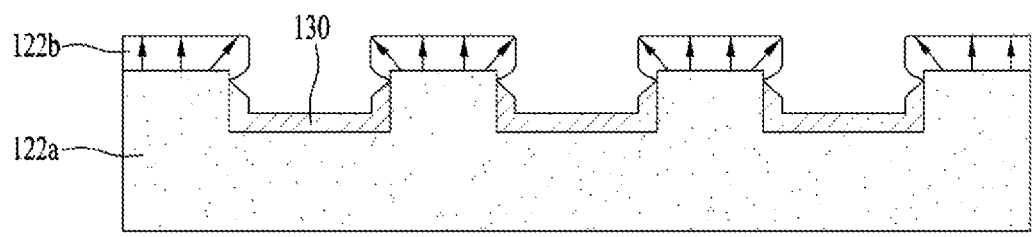
Figure 4D:
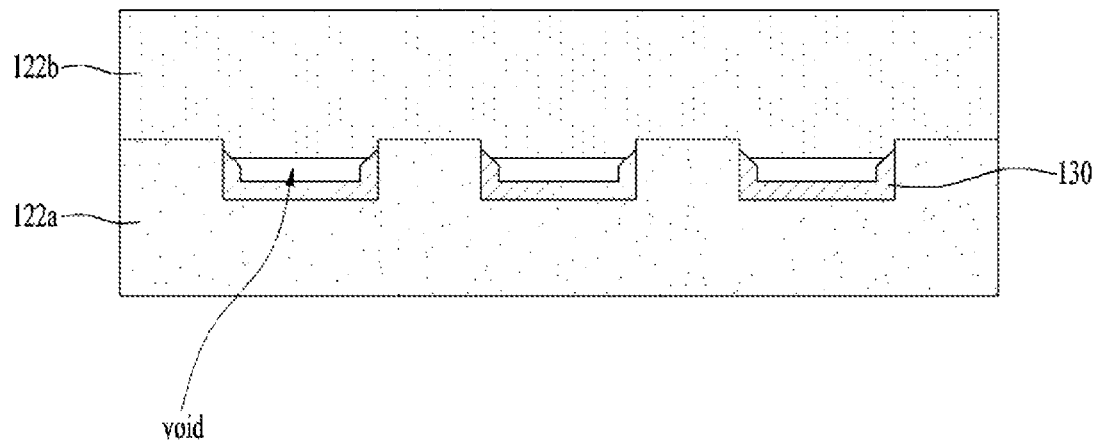

In addition, as shown in FIGS. 4C and 4D, the second layer 122b is grown on the first layer 122a. A seed for growing the second layer 122b is dispersed on the exposed surface of the first layer 122a and, as shown in FIG. 4C, the second layer 122b is grown in a vertical direction as well as in a horizontal direction on the exposed surface of the first layer 122a.

In addition, along the horizontal growth of the second layer 122b, as shown in FIG. 4D, the second layer 122b grows to cover an upper region corresponding to the first groove.

The second layer 122b may grow while filling the first groove, excluding the shown void. As shown in FIG. 4D, the bottom surface of the second layer 122b grows to an inclined region of an upper part of the growth prevention layer 130, but in actual, the second layer 122b may grow to a part of the side surface of the growth prevention layer 130, as shown in FIG. 3C. That is, the second layer 122b can grow in a horizontal direction as well as in a downward direction to some extent. In addition, although some seeds for growing the second layer 122b are dispersed on the surface of the growth prevention layer 130, they may not be grown into a nitride-based semiconductor layer.

Accordingly, dislocation of the second layer is prevented, which may improve quality of the nitride-based semiconductor. In addition, since the nitride-based semiconductor is not grown on the growth prevention layer 130, voids are created in the first groove, which scatter light travelling downward from the active layer 124, thereby improving light extraction efficiency of the light emitting device.

Figure 4E:
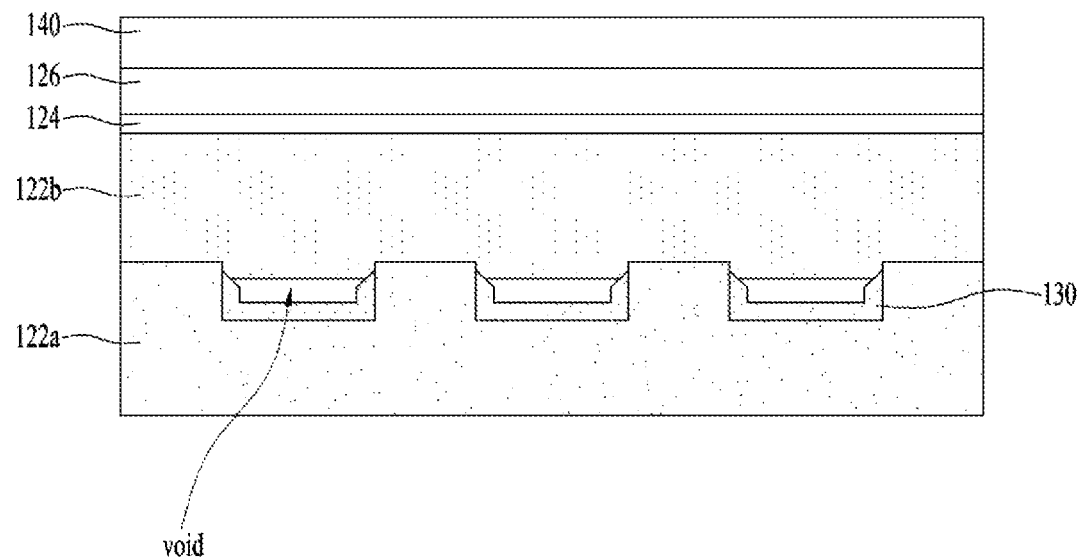

Also, as shown in FIG. 4E, an active layer 124 and a light-transmitting conductive layer 140 may be grown on the second layer 122b.

Figure 4F:
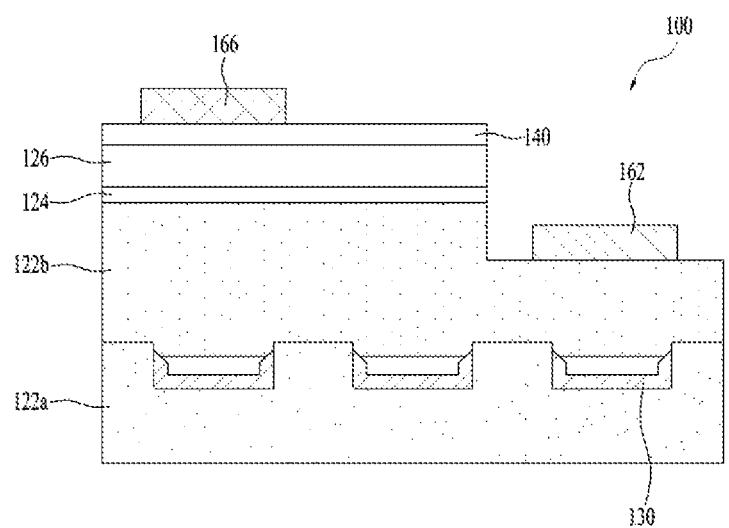

As shown in FIG. 4F, mesa-etching is conducted from the light-transmitting conductive layer 140 to the second conductivity-type semiconductor layer 126, the active layer 124, and a part of the second layer 122b to expose a part of the second layer 122b, a first electrode 162 is then disposed on the etched and exposed second layer 122b and a second electrode 166 is disposed on the light-transmitting conductive layer 140.

Figure 5A:
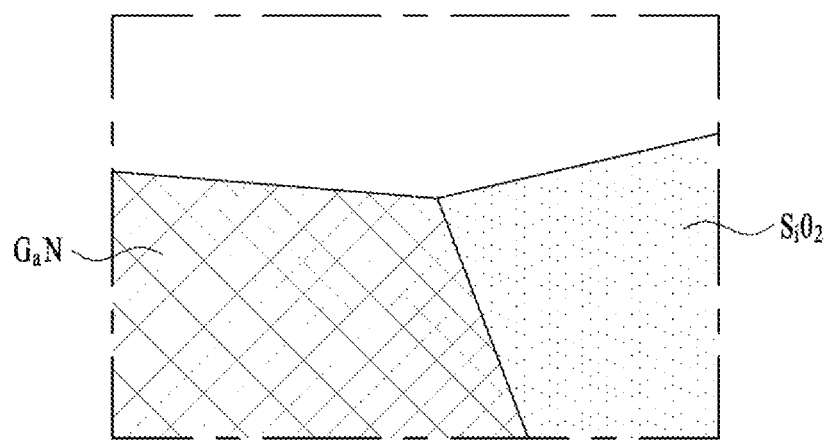
FIG. 5A shows a growth prevention layer formed on a nitride-based semiconductor layer.
Figure 5B:
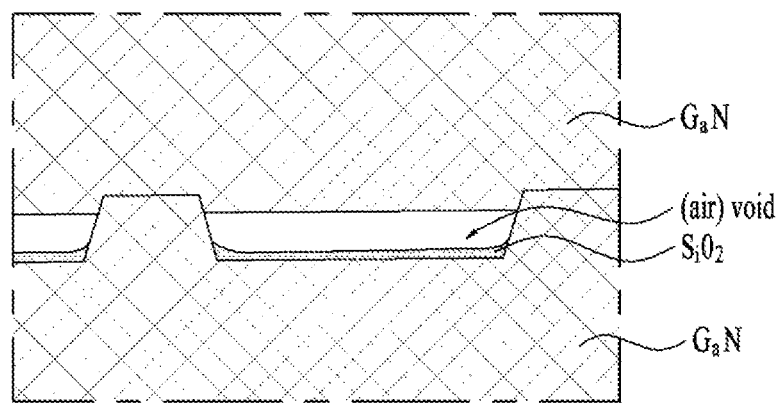
FIG. 5B shows growth of a second layer after growth of the growth prevention layer.

FIG. 5A shows a growth prevention layer formed on the nitride-based semiconductor layer and FIG. 5B shows growth of a second layer after growth of the growth prevention layer.

FIG. 5A shows a growth prevention layer ($SiO_2$) formed on a side surface of a nitride-based semiconductor layer (GaN), and FIG. 5B shows a state in which a second layer is grown and fills a part of a void after growth of the growth prevention layer ($SiO_2$).

Figure 6:
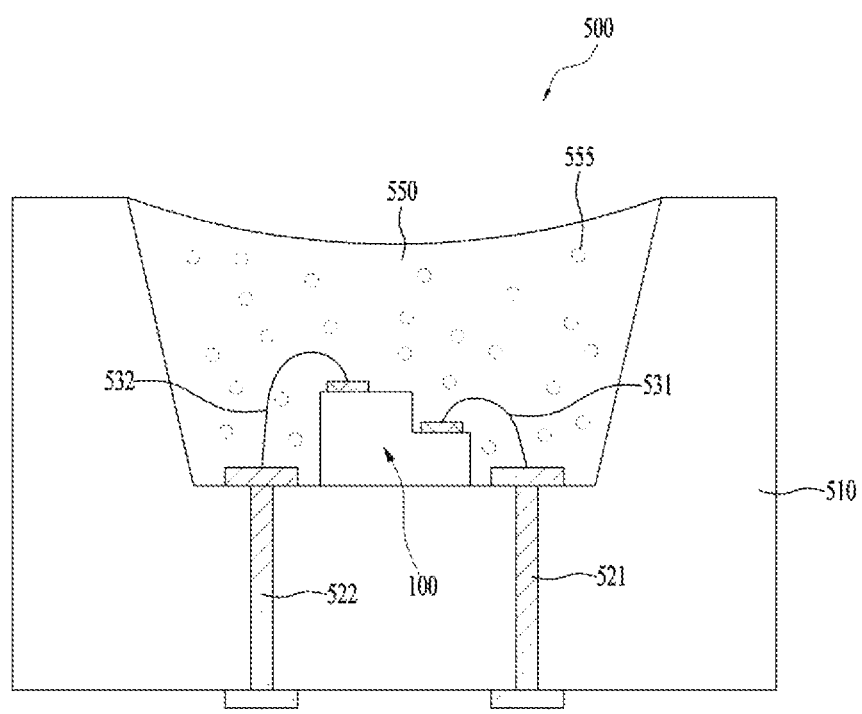
FIG. 6 illustrates an embodiment of a light emitting device package, in which a light emitting device is disposed.

FIG. 6 illustrates an embodiment of a light emitting device package, in which the light emitting device is disposed.

The light emitting device package 500 according to the present embodiment includes a body 510 having a cavity, a first lead frame 521 and a second lead frame 522 disposed on the body 510, the light emitting device 100 according to the aforementioned embodiments, being installed on the body 510 and electrically connected to the first lead frame 521 and the second lead frame 522, and a molding part 550 formed in the cavity.

The body 510 may include a silicon material, a synthetic resin material or a metal material. When the body 510 is formed of a conductive material such as a metal material, although not shown, an insulating layer may be coated on a surface of the body 510 to prevent electrical short-circuit between the first and second lead frames 521 and 522.

The first lead frame 521 and the second lead frame 522 are electrically isolated from each other, and serve to supply current to the light emitting device 100. In addition, the first lead frame 521 and the second lead frame 522 may reflect light generated in the light emitting device 100 to increase light efficiency and may outwardly dissipate heat generated by the light emitting device 100.

The molding part 550 may surround and protect the light emitting device 100. In addition, a phosphor 555 may be incorporated in the molding part 550 to convert a wavelength of light emitted from the light emitting device 100. The phosphor 555 may be a YAG-based phosphor, a nitride-based phosphor or a silicate-based phosphor.

Light with a first wavelength range, emitted from the light emitting device 100, is excited by the phosphor 555 and is converted into light with a second wavelength range and the light with the second wavelength range passes through a lens (not shown), thus changing a light passage.

The light emitting device package 500 may include one or more of the light emitting devices according to the embodiments, but the present invention is not limited thereto.

The light emitting device or the light emitting device package may be used as a light source of a lighting system, for example, a backlight unit of an image display device or a lighting apparatus.

When the light emitting device or the light emitting device package is used for a backlight unit of an image display device, it may be used as an edge- or direct-type backlight unit. When the light emitting device or the light emitting device package is used for the lighting system, it may be used as a light source of a light bulb or a belt-type light source.

Meanwhile, although embodiments have been disclosed, they are provided only for illustrative purposes and should not be construed as limiting the scope of the present invention. It will be apparent to those skilled in the art that various modifications and variations can be made in the present invention without departing from the spirit or scope of the invention. For example, respective constituent components described in embodiments can be modified for implementation. Furthermore, differences related to such modification and application should be construed as falling within the scope of the present invention.

INDUSTRIAL APPLICABILITY

The light emitting device according to the embodiment can improve quality of the nitride-based semiconductor and light extraction efficiency of the light emitting device.

The invention claimed is:

1. A light emitting device comprising:
   a first conductivity-type semiconductor layer including a first layer and a second layer;
   an active layer disposed on the first conductivity-type semiconductor layer;
   a second conductivity-type semiconductor layer disposed on the active layer; and
   a first electrode and a second electrode disposed on the first conductivity-type semiconductor layer and the second conductivity-type semiconductor layer, respectively,
   wherein the first layer includes a plurality of first grooves, and a growth prevention layer is disposed on a bottom surface and a side surface of one of the first grooves, and
   wherein the growth prevention layer has:
      an exterior side surface facing the side surface of the first groove,
      an interior side surface opposite to the side surface of the first groove,
      an exterior bottom surface facing the bottom surface of the first groove,
      an interior bottom surface opposite to the bottom surface of the first groove, a height of a top of the exterior side surface from the interior bottom surface being greater than a height of a top of the interior side surface from the interior bottom surface, and
      an inclined surface extending between the top of the exterior side surface and the top of the interior side surface.

2. The light emitting device according to claim 1, wherein the growth prevention layer comprises a material selected from the group consisting of $SiO_2$, $Si_3N_4$, SiC, $Al_2O_3$, AlN, $HfO_2$, $TiO_2$, $ZrO_2$, $Ta_2O_3$, Cr, Ta, Mo and W.

3. The light emitting device according to claim 1, wherein a portion of the second layer is inserted into an upper part of the first groove.

4. The light emitting device according to claim 1, wherein a void is formed in a part of the first groove.

5. The light emitting device according to claim 1, wherein a thickness of the growth prevention layer on the side surface of the first groove is 30 nanometers or more.

6. The light emitting device according to claim 1, wherein a thickness of the growth prevention layer at the side surface of the first groove is smaller than a thickness of the growth prevention layer at the bottom surface of the first groove.

7. The light emitting device according to claim 1, wherein a height from the interior bottom surface of the growth prevention layer to a top of the exterior side surface of the growth prevention layer is 200 nanometers to 2000 nanometers.

8. The light emitting device according to claim 1, wherein the inclined surface of the growth prevention layer and the exterior side surface of the growth prevention layer facing the side surface of the first groove form an angle of 70 degrees or less.

9. The light emitting device according to claim 1, wherein a portion of the second layer is inserted into an upper part of the first groove, and an end of the second layer is disposed at the inclined surface of the growth prevention layer.

10. A light emitting device comprising:
    a first conductivity-type semiconductor layer including a first layer and a second layer;
    an active layer disposed on the first conductivity-type semiconductor layer;

a second conductivity-type semiconductor layer disposed on the active layer; and a first electrode and a second electrode disposed on the first conductivity-type semiconductor layer and the second conductivity-type semiconductor layer, respectively, wherein:
- the first layer includes a plurality of first grooves,
- a first growth prevention layer and a second growth prevention layer are sequentially disposed on a bottom surface and a side surface of one of the first grooves,
- the first growth prevention layer includes a side segment positioned between the side surface of the first groove and a side segment of the second growth prevention layer, and
- a height of a top of the side segment of the first growth prevention layer from an interior bottom surface of the second growth prevention layer, which is opposite to the bottom surface of the first groove, is greater than a height of a top of the side segment of the second growth prevention layer from the interior bottom surface of the second growth prevention layer.

11. The light emitting device according to claim 10, wherein a difference in height between the top of the side segment of the first growth prevention layer and the top of the side segment of the second growth prevention layer is at least 100 nanometers.

12. The light emitting device according to claim 10, wherein the first growth prevention layer and the second growth prevention layer comprise a material selected from the group consisting of $SiO_2$, $Si_3N_4$, SiC, $Al_2O_3$, AlN, $HfO_2$, $TiO_2$, $ZrO_2$, $Ta_2O_3$, Cr, Ta, Mo and W.

13. The light emitting device according to claim 10, wherein a portion of the second layer is inserted into an upper part of the first groove and contacts the first growth prevention layer.

14. The light emitting device according to claim 12, wherein the second layer is spaced from the second growth prevention layer.

15. The light emitting device according to claim 10, wherein a void is formed in a part of the first groove.

16. The light emitting device according to claim 10, wherein a portion of the second layer is inserted into an upper part of the first groove.

17. The light emitting device according to claim 10, wherein a sum of a thickness of the first growth prevention layer and a thickness of the second growth prevention layer is 30 nanometers or more.

18. A light emitting device comprising:
an insulating substrate;
a first conductivity-type semiconductor layer disposed on the insulating substrate and including a first layer and a second layer;
an active layer disposed on the first conductivity-type semiconductor layer;
a second conductivity-type semiconductor layer disposed on the active layer; and
a first electrode and a second electrode disposed on the first conductivity-type semiconductor layer and the second conductivity-type semiconductor layer, respectively,
wherein the first layer includes a plurality of first grooves and a growth prevention layer is disposed on a bottom surface and a side surface of one of the first grooves,
wherein the growth prevention layer has an inclined surface between a top of an exterior side surface facing the side surface of the first groove and a top of an interior side surface that is opposite to the side surface of the first groove,
wherein a height of the growth prevention layer between the bottom surface of the first groove and the top of the exterior side surface of the growth prevention layer is greater than a height of the growth prevention layer between the bottom surface of the first groove and the top of the interior side surface of the growth prevention layer, and
wherein the growth prevention layer includes an exterior bottom surface facing the bottom surface of the first groove and an interior bottom surface that is opposite to the bottom surface of the first groove, and a height from the interior bottom surface of the growth prevention layer to a top of the growth prevention layer is 200 nanometers to 2000 nanometers.

19. The light emitting device according to claim 18, wherein the inclined surface and the exterior surface of the growth prevention layer adjacent to the side surface of the first groove form an angle of 70 degrees or less.

* * * * *